(12) United States Patent
Anderl

(10) Patent No.: US 10,306,807 B2
(45) Date of Patent: *May 28, 2019

(54) ENHANCED COOLING DESIGN FOR COMPUTING DEVICE

(71) Applicant: International Business Machines Corporation, Armonk, NY (US)

(72) Inventor: William J. Anderl, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/934,978

(22) Filed: Mar. 24, 2018

(65) Prior Publication Data

US 2018/0213683 A1 Jul. 26, 2018

Related U.S. Application Data

(63) Continuation of application No. 15/379,036, filed on Dec. 14, 2016, now Pat. No. 10,085,366.

(51) Int. Cl.
*H05K 7/20* (2006.01)
*G06F 1/20* (2006.01)

(52) U.S. Cl.
CPC .......... *H05K 7/20727* (2013.01); *G06F 1/20* (2013.01); *H05K 7/20145* (2013.01); *H05K 7/20563* (2013.01)

(58) Field of Classification Search
CPC ...... G06F 1/20; G06F 2200/201; G06F 1/187; H05K 7/20145; H05K 7/20563; H05K 7/20727

(Continued)

(56) References Cited

U.S. PATENT DOCUMENTS 6,081,423 A 6/2000 Griffin
6,538,886 B2 * 3/2003 Yu .............................. G06F 1/20
165/122

(Continued)

FOREIGN PATENT DOCUMENTS

GB 2174193 A 10/1986
JP 2007156098 A 6/2007

OTHER PUBLICATIONS

Ahlem Arfaoui et al., "Experimental and Numerical Study of Flow Deflection Effects on Electronic Air-Cooling", International Symposium on Convective Heat and Mass Transfer in Sustainable Energy, Apr. 26-May 1, 2009, Tunisia, vol. 1. 20 pages.

(Continued)

*Primary Examiner* — Zachary Pape
(74) *Attorney, Agent, or Firm* — Marcia L. Doubet

(57) ABSTRACT

Enhanced cooling for electronic components within a computing device is provided. Blowers are preferably leveraged as air movers, and an airflow deflection surface (preferably configured as a ramp) is disposed within a plenum to guide airflow under an electronic component (such as a hard disk drive or solid state drive), the electronic component being placed in an inverted alignment whereby a surface having a higher heat transfer rate is facing down (toward the blower), and then into an intake of the blower. Air output from the blower may then pass into a downstream plenum formed at least in part by the blower, an inverted downstream electronic component, and a support member thereof, thus providing serial cooling of the downstream component. Anti-recirculation flaps are preferably disposed at the air output of the blower.

20 Claims, 7 Drawing Sheets

(58) Field of Classification Search
USPC ................. 361/679.46–679.54, 688–723
See application file for complete search history.

(56) References Cited

U.S. PATENT DOCUMENTS

| | | | |
|---|---|---|---|
| 6,646,876 B2 * | 11/2003 | Carr ...................... | G06F 1/181 |
| | | | 361/679.33 |
| 7,123,478 B2 | 10/2006 | Chen | |
| 7,307,843 B2 * | 12/2007 | Harman ............... | G11B 33/142 |
| | | | 361/679.48 |
| 7,403,387 B2 | 7/2008 | Pav et al. | |
| 7,495,906 B2 | 2/2009 | Fujie et al. | |
| 8,009,417 B2 | 8/2011 | Searby et al. | |
| 8,477,496 B2 | 7/2013 | Zhang et al. | |
| 8,553,411 B2 * | 10/2013 | Abraham ................ | G06F 1/20 |
| | | | 361/679.47 |
| 8,780,550 B2 | 7/2014 | Curtis et al. | |
| 8,780,551 B2 | 7/2014 | Farnholtz | |
| 9,058,159 B2 | 6/2015 | Lee et al. | |
| 9,443,560 B2 * | 9/2016 | Szeremeta ........... | G11B 33/128 |
| 9,877,415 B2 * | 1/2018 | Szeremeta ......... | H05K 7/20736 |
| 2007/0041159 A1 * | 2/2007 | Bate .................... | G11B 33/142 |
| | | | 361/697 |
| 2014/0036433 A1 | 2/2014 | Guan | |

OTHER PUBLICATIONS

List of IBM Patents or Patent Applications Treated as Related. Mar. 24, 2018. 2 pages.

* cited by examiner

ENHANCED COOLING DESIGN FOR COMPUTING DEVICE

BACKGROUND OF THE INVENTION

The present invention relates to enhanced cooling for electronic components within a computing device, and deals more particularly with providing increased cooling while leveraging blowers as air movers.

Physical space inside a computing device such as a server is limited, and it is desirable to use this space efficiently and effectively. It is desirable to accommodate as many hard disk drives or solid state drives within a computing device as technically feasible, for example, to provide optimum storage from the computing device. (Hard disk drives are also referred to herein as hard drives or disk drives, or simply as drives. References to such drives should be interpreted as including solid state drives.) More disk drives operating mean more heat generated, however, and sufficient cooling must be provided so that the drives (and other components) do not overheat.

BRIEF SUMMARY OF THE INVENTION

The present invention provides for enhanced cooling of components inside a computing device. In one embodiment, an enhanced cooling solution preferably comprises: an air mover having an intake and an exit; an electronic component placed in an inverted alignment whereby a surface thereof having a higher heat transfer rate is facing downward toward the air mover; an airflow deflection surface disposed in a plenum, the plenum being disposed between the air mover and the surface of the electronic component; and the airflow deflection surface and the intake causing an airflow path that cools the surface of the electronic component to pass, at least in part, between the downward-facing surface of the electronic component and an upper side of the airflow deflection surface before entering into the intake of the air mover, the upper side of the airflow deflection surface being disposed toward the downward-facing surface of the electronic component, wherein: air enters the cooling system through a chamber disposed on an outer wall of a housing of the computing device, the chamber comprising an outer chamber wall and an inner chamber wall, the outer chamber wall comprising a first plurality of perforations that allow the air to enter the chamber and the inner chamber wall comprising a second plurality of perforations that allow the air to enter the cooling system without being overly impeded, the second plurality of perforations being fewer in number than the first plurality; and the second plurality of perforations are positioned so as to cause the airflow to enter into the plenum in close proximity to the downward-facing surface of the electronic component before being forced into the air mover by the airflow deflection surface. The cooling system may further comprise: a downstream electronic component, the downstream electronic component placed in the inverted alignment whereby the surface thereof having the higher heat transfer rate is facing downward toward the exit of the air mover; a downstream plenum, the downstream plenum formed at least in part by the downward-facing surface of the downstream electronic component, the air mover, and a support member supporting the downstream electronic component, the downstream plenum receiving airflow from the exit of the air mover and causing the airflow path to cool the surface of the downstream electronic component by passing, at least in part, beneath the downward-facing surface of the downstream electronic component before exiting from the downstream plenum. The support member is preferably configured with a plurality of perforations, the perforations providing airflow impedance to pressurize the downstream plenum while allowing the airflow to exit the downstream plenum. The air mover is preferably a blower. In another embodiment, a method for enhanced cooling of electronic components within a computing device is provided, comprising: disposing an air mover within a housing of the computing device, the air mover having an intake and an exit; placing an electronic component within the housing in an inverted alignment whereby a surface thereof having a higher heat transfer rate is facing downward toward the air mover; disposing an airflow deflection surface in a plenum within the housing, the plenum being disposed between the air mover and the surface of the electronic component, whereby the airflow deflection surface and the intake cause an airflow path that cools the surface of the electronic component to pass, at least in part, between the downward-facing surface of the electronic component and an upper side of the airflow deflection surface before entering into the intake of the air mover, the upper side of the airflow deflection surface being disposed toward the downward-facing surface of the electronic component, wherein: air enters the cooling system through a hollow chamber disposed as an outer wall of a housing of the computing device, the hollow chamber comprising a outer chamber wall and an inner chamber wall, the outer chamber wall comprising a first plurality of perforations that allow the air to enter the chamber and the inner chamber wall comprising a second plurality of perforations that allow the air to enter the cooling system without being overly impeded, the second plurality of perforations being fewer in number than the first plurality; and the second plurality of perforations are clustered in an upper portion of the inner chamber wall to cause the airflow to enter into the plenum from an upper height so as to be in close proximity to the downward-facing surface of the electronic component before being forced downward into the air mover by the airflow deflection surface.

These and other aspects of the present invention may be provided in one or more embodiments. It should be noted that the foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined by the appended claims, will become apparent in the non-limiting detailed description set forth below.

BRIEF DESCRIPTION OF THE SEVERAL VIEWS OF THE DRAWINGS

The present invention will be described with reference to the following drawings, in which like reference numbers denote the same element throughout.

DETAILED DESCRIPTION OF THE INVENTION

Embodiments of the present invention are directed toward enhanced cooling for electronic components within a computing device. An embodiment provides increased cooling while leveraging blowers as air movers. As noted earlier, it is desirable to accommodate as many disk drives within a computing device as technically feasible. It is also desirable to have as many hard drives accessible from the front of the system as possible. Having the system's air moving devices, such as fans or blowers, at the front of the system is often the best solution of providing airflow into the system. An embodiment of the present invention is configured to house air movers for the computing device within the same physical space that some prior art devices used for only the disk drives. (For ease of reference, the term "server" is used herein to refer to the computing device, although this is by way of illustration and not of limitation.) Prior art approaches to cooling components within a server used counter-rotating fans, and the volumetric space for those fans was typically internal to the server—either occupying space above the mother board or sandwiched between the top and bottom of the chassis. With increased placement of memory or other components within the server, however, it is no longer feasible to use counter-rotating fans (e.g., because space previously used for the fans is either reduced or is simply no longer available, or because placing the fans in alternative locations would result in physical constraints on the air intake that would lead to inadequate cooling).

An embodiment of the present invention provides enhanced cooling for hard drives that are now rotated flat 90 degrees (as compared to a prior art configuration) and located above the air movers, rather than a prior art approach of using hanging hard drives located upstream from air movers, or downstream therefrom if the bank(s) of hard drives are internal to the system or at the rear of the system. Prior art approaches using blowers conventionally draw airflow from one plane and exhaust it out at a 90 degree angle, and do not place drives above air movers because it is difficult to get airflow directed to where it needs to be. Accordingly, using blowers in a conventional configuration would result in insufficient airflow. An embodiment of the present invention inverts the hard drives, placing them into a configuration that most observers would consider to be "upside down". This is intentional, however, because there is better cooling on one side of a hard drive in the configuration used by an embodiment of the present invention, which places this side as close to the airflow path as is feasible.

Figure 1:
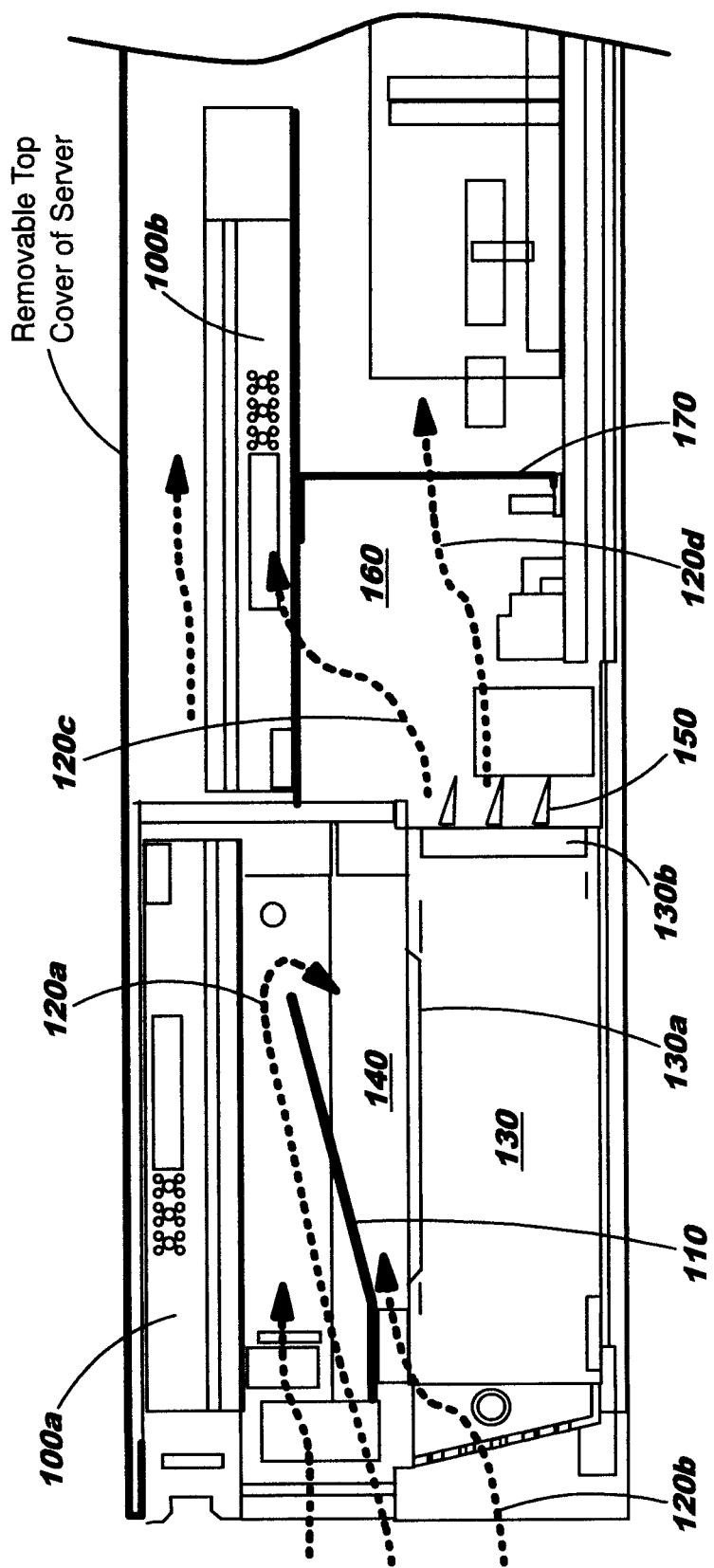
FIG. 1 illustrates an example configuration for placement of drives and an air mover, according to an embodiment of the present invention.

FIG. 1 illustrates an example configuration for placement of drives and an air mover, according to an embodiment of the present invention, where this configuration depicts two inverted hard drives 100*a*, 100*b* and a blower 130. Note that an embodiment of the present invention may include any number of internal inverted hard drives that can fit into the system. A first of the two hard drives 100*a* is placed over the blower 130, and a second of the hard drives 100*b* is placed downstream from the first hard drive 100*a*. Downstream in this connotation means that the first hard drive 100*a* is typically placed, along with other similar hard drives, along a front edge of the server. Hard drive 100*b* is located behind—i.e., downstream of—hard drive 100*a* in terms of physical placement and airflow.

Notably, the hotter side of a hard drive 100*a*, 100*b* is not placed as the topmost side, even though heat rises, because the rate of airflow when using an embodiment of the present invention far outweighs the rate of heat rising. Accordingly, an embodiment of the present invention places the side of the drive that has the higher heat transfer rate as facing down, toward the air mover, thereby exposing the surface of the drive to the highest airflow velocity. Therefore, it is not necessary to pull air around the surfaces of the drives (although some air can leak around all sides, flushing the heated airflow away from the hard drives), which instead are primarily cooled by airflow directed toward one side thereof when using an embodiment of the present invention.

FIG. 1 also illustrates placement of an airflow deflection surface 110 between the under side of the first hard drive 100*a* and the blower 130. This airflow deflection surface 110 is angled upward within the plenum shown generally at 140 (i.e., within the air space existing between the lower surface of hard drive 100*a* and the upper surface of blower 130). Airflow deflection surface 110 is also referred to herein as a ramp, for ease of reference. The airflow deflection surface may be comprised of one or more angled ramp pieces. (See FIG. 5, for example, illustrating a plurality of ramps 110.) Alternatively, the ramp may be one piece at a similar angle, but this may lead to suboptimal results. Airflow enters the configuration illustrated in FIG. 1 generally from the left-hand side; see the arrows denoted by reference numbers 120*a*, 120*b*. Arrow 120*b* corresponds generally to an airflow path where room air directly enters the blower 130 through an intake area 130*a*, as in a prior art approach. Preferably, a perforated surface is present alongside an outer edge of blower 130 (and perforations may also extend upward for an entirety of this edge of the housing, and this is discussed below with reference to FIGS. 5 and 6), allowing room air to enter while preventing entry of objects into the housing of the system. Air entering according to arrow 120*b* is generally drawn into the system by low pressure created at the blower intake area 130*a*. Arrow 120*a* corresponds to an airflow path where air enters the plenum 140 and is forced upward by the angle of the ramp 110. Once the air reaches the far end of the ramp 110, arrow 120*a* shows that the path of the airflow then turns downward, entering intake area 130*a* of the blower 130.

Notably, ramp 110 entices the airflow into the system as far as feasibly possible, keeping the cooling airflow up against the surface of the hard drive until that air reaches the end of the ramp; without this ramp 110, air would come into the system as shown by arrow 120*b* and would go directly into blower intake area 130*a*, bypassing the surface of the hard drive 100*a*. Preferably, the angle of ramp 110 is adapted so as to keep the ramp as far above the blower intake area 130*a* as technically feasible, to thereby maximize the cooling path of the airflow along the surface of hard drive 110*a* as well as to maximize airflow intake of the blower. The placement and length of ramp 110 determine how far the airflow will travel along the surface of hard drive 110*a*. The dimension between the lower surface of hard drive 110*a* and the highest end of ramp 110 serves to balance the amount of airflow above and below the ramp. Ramp 110 may be constructed of generally any solid material that does not induce airflow drag, including steel, a rubber membrane, or foam, as several examples of non-limiting choices.

Once air enters blower 130, it is pushed out into the rest of the system. In the configuration shown in FIG. 1, this corresponds generally to air exiting blower 130 from a blower exit area 130b (shown on the right-hand side of blower 130) into another plenum 160; see the arrows denoted by reference numbers 120c, 120d. Blower 130 is preferably configured with a plurality of anti-recirculation flaps 150 on this blower exit area 130c. These flaps aim to prevent airflow that exits blower 130 from flowing in the opposite direction back through the blower in the event of a blower failure. In addition, flaps 150 may aid in equalizing airflow distribution within the plenum 160. Each blower used in the system may have the same, or a different, number of flaps. The example configuration in FIG. 1 depicts use of three flaps at 150, by way of illustration but not of limitation. Flaps 150 are preferably constructed of a lightweight, yet stiff, material. Examples of material that may be used for flaps 150 include polycarbonate or plastic. Plenum 160 is generally bounded at the top by downstream hard drive 100b and bounded at the sides by blower 130 and a support member 170 that supports hard drive 100b. Support member 170 is preferably a perforated wall, where the perforations provide sufficient airflow impedance to create a pressurized plenum 160 that better distributes airflow for cooling the system and also knocks down (i.e., reduces) the localized high-velocity airflow exiting from blower 130. Accordingly, arrow 120c corresponds generally to an airflow path where air within plenum 160 blows upward, against the surface of downstream hard drive 100b. Arrow 120d, on the other hand, corresponds to an airflow path where air within plenum 160 escapes through perforations of support member 170. A configuration as illustrated in FIG. 1 minimizes pressure drop within the system while maximizing air velocity along the hard drives and optimizes the balance of airflow in the system, which in turn maximizes cooling. When using techniques disclosed herein, including the multi-angled ducting provided by airflow deflection surface 110 and serial cooling provided by the airflow path, the downstream components are cooled with generally the same efficiency (i.e., cooled to generally an equal temperature) as the upstream components.

Figure 2:
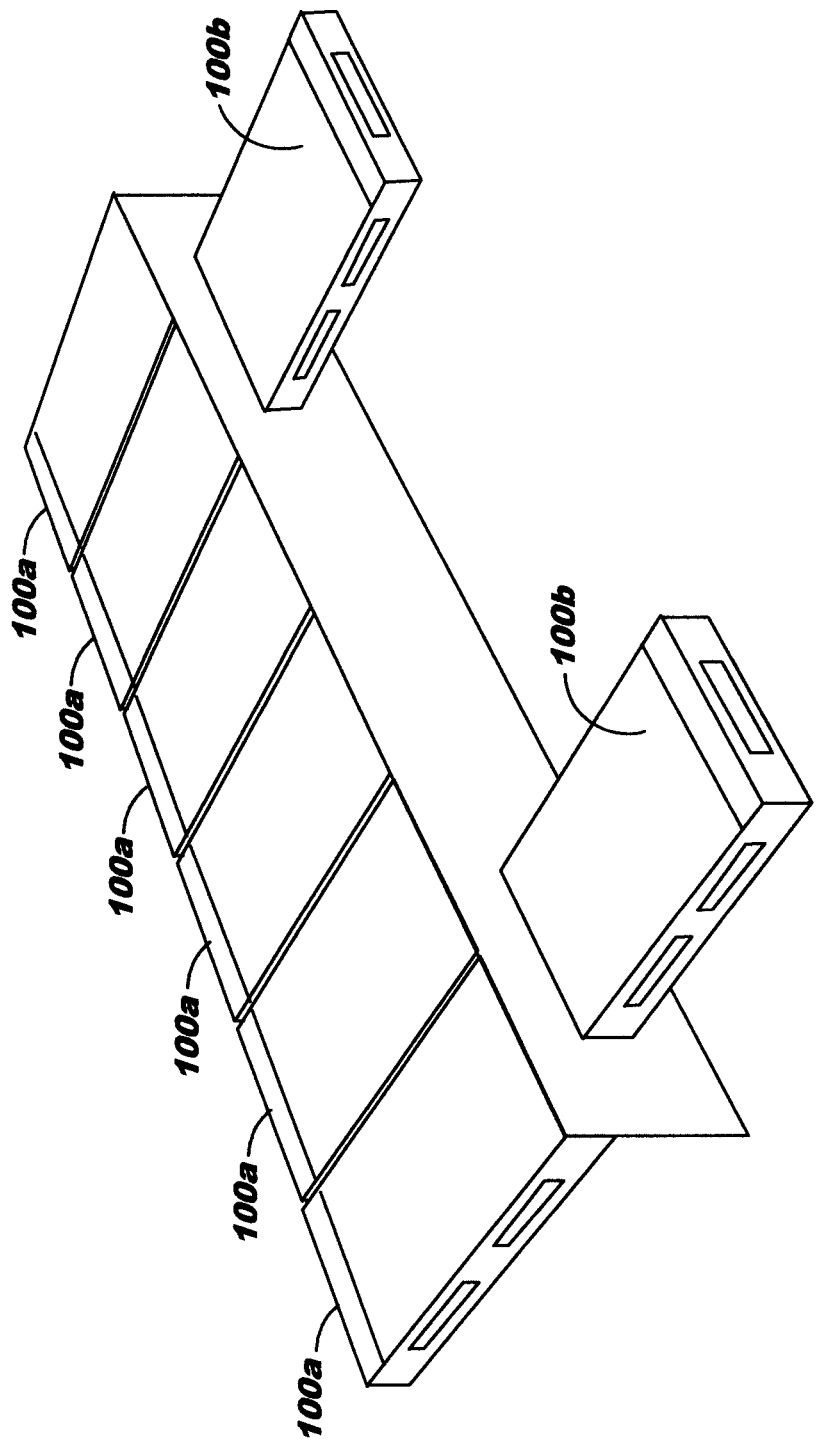
FIG. 2 provides an illustration of hard drives arranged in a two-level configuration, where a second level is downstream of a first level, and FIG. 3 provides another view of the system, showing how the presence of first-level hard drives may look from an end of the computing device.

Note that the number of successive hard drive levels is shown in FIG. 1 as two by way of illustration but not of limitation: a configuration using a single level of hard drive or a configuration using more than two successive levels of hard drives is also within the scope of the present invention. FIG. 2 provides an illustration of hard drives arranged in a two-level configuration, having six hard drives in the first level and two in the second level. (Placement of two hard drives in the second level is by way of illustration and not of limitation.) Reference numbers 100a of the first level correspond to 100a of FIG. 1, and reference numbers 100b of the second level correspond to 100b of FIG. 1. Generally, a configuration may support as many successive hard drive levels as will fit within the system housing, and the airflow balancing plenum is preferably designed for that possibility. In addition, it should be noted that while discussions herein refer primarily to inverted disk drives, an embodiment of the present invention may also be used with other types of components. By way of example, an inverted hard drive form factor might be used to hold a redundant array of independent Solid State Drives (SSDs), an electronic component card, or a micro-tape drive.

Figure 3:
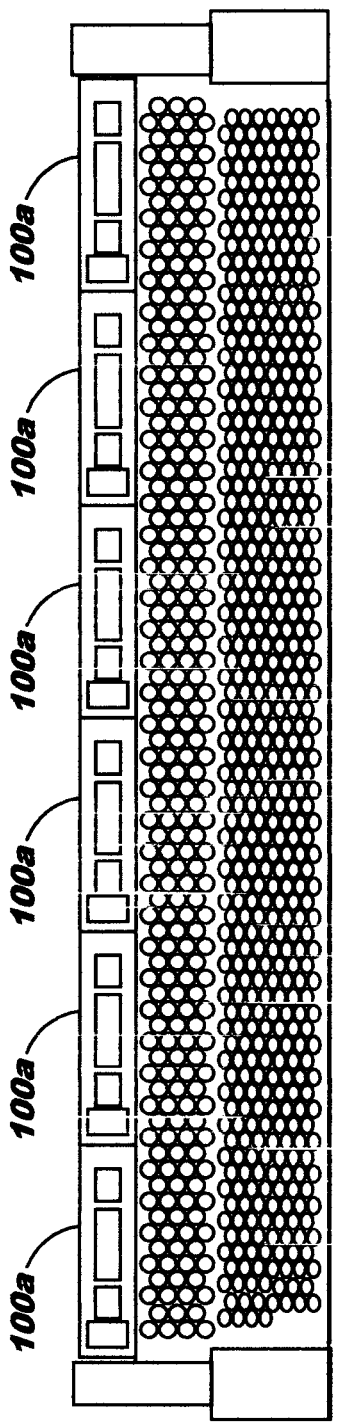

FIG. 3 provides another view of the system, showing how the presence of first-level hard drives 100a may look from an end of the computing device.

Figure 4:
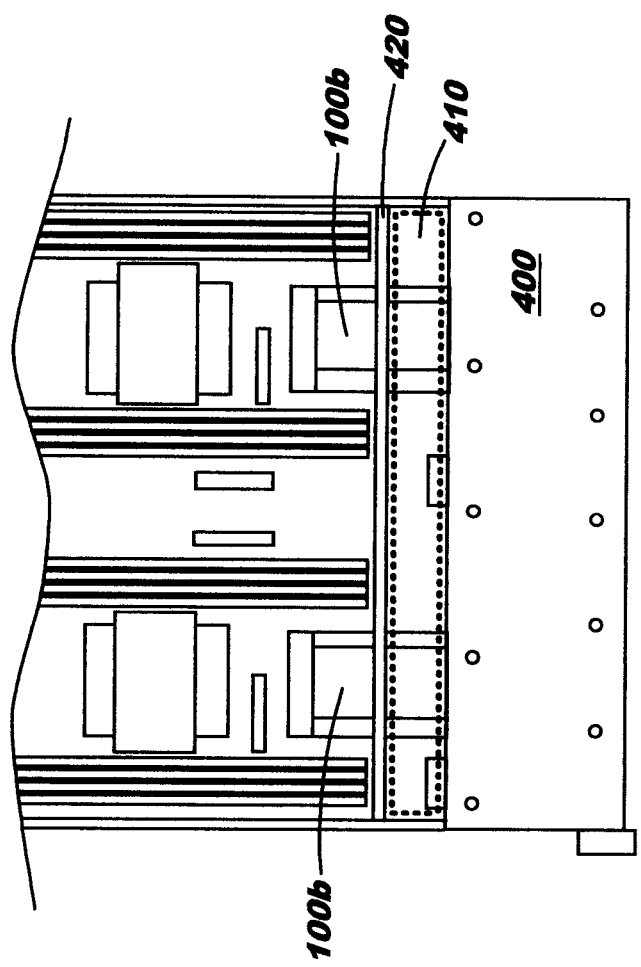
FIG. 4 depicts a top view of the computing device, illustrating a side-to-side plenum.

FIG. 4 depicts a top view of the computing device, where first-level hard drives 100a are covered, in this illustration, by a structural member of some type; see reference number 400. Arrow 410 points to a dashed rectangle (provided for illustration only) that generally corresponds to the plenum 160. Accordingly, it can be seen that plenum 160 generally encompasses the entire side-to-side width of the computing device. In this example configuration, two downstream hard drives 100b each have an underlying support member 170 (not visible in FIG. 4; see support member 170 of FIG. 1), and this support member may optionally extend the entire side-to-side width. Also in this example configuration, a rectangular bulkhead 420 is depicted, and drives 100b are shown (by way of illustration only) as being inserted through this bulkhead 420.

Figure 5:
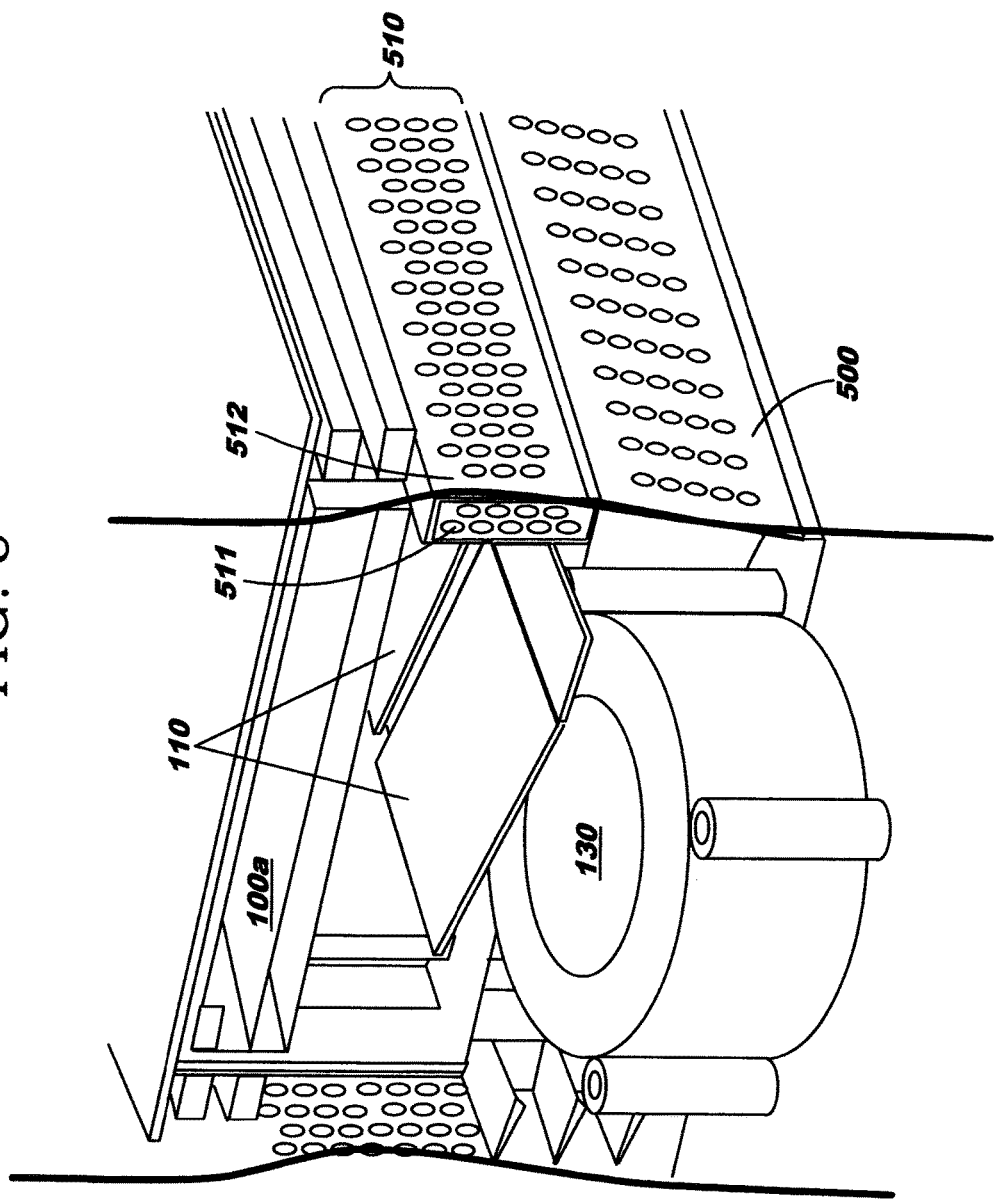
FIG. 5 illustrates a side view of an example configuration, illustrating use of a perforated segment as a type of outer wall alongside an outer edge of a blower.
Figure 6:
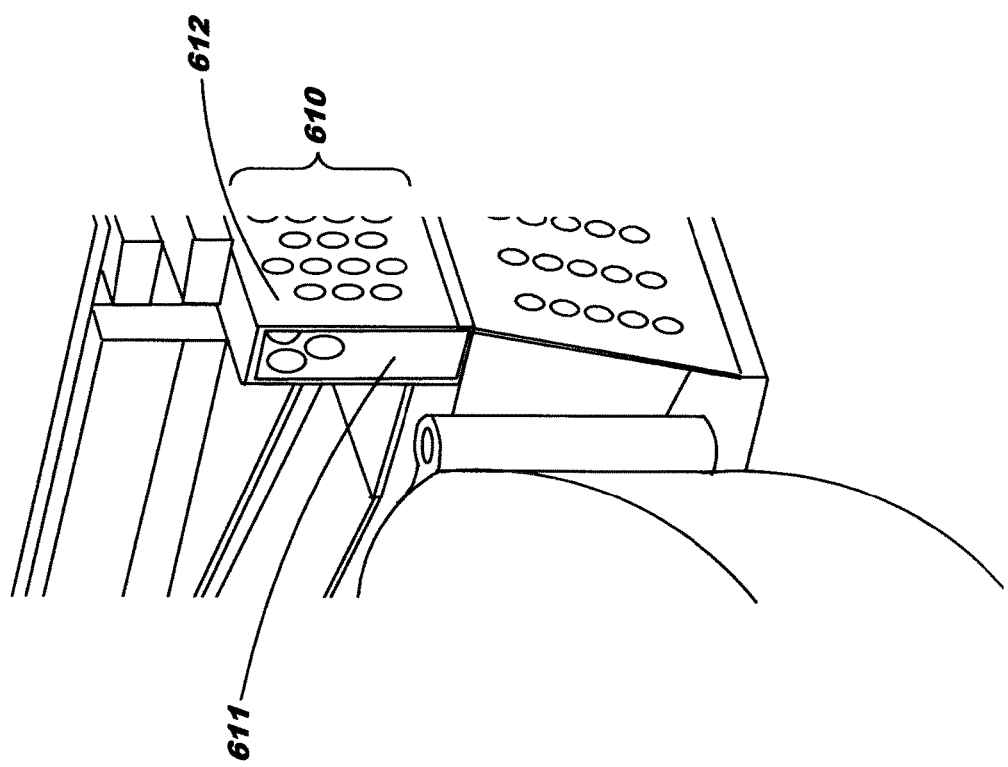
FIG. 6 illustrates an alternative version of such perforated segment.

FIG. 5 illustrates a side view of an example configuration, where reference number 130 corresponds to blower 130 of FIG. 1, reference number 100a corresponds to hard drive 100a of FIG. 1, and reference number 110 corresponds to ramp 110 of FIG. 1. FIG. 5 illustrates use of a perforated surface as a type of outer wall alongside an outer edge of blower 130, denoted in FIG. 5 using reference number 500. A perforated segment 510 is also depicted, where this perforated segment 510 forms a type of outer wall that extends generally from a level of the top of the blower 130 to a level of the bottom of hard drive 100a. In the depicted example, perforated segment 510 is shown as a hollow chamber having perforations on both the interior wall 511 and exterior wall 512. These perforations in segment 510 allow room air to enter plenum 140 without being overly impeded. An alternative version 610 of perforated segment 510 is shown in FIG. 6, where the interior wall 611 of perforated segment 610 has fewer perforations as compared to the interior wall 511 (and exterior wall 612 is the same as exterior wall 512). Notably, the perforations in interior wall 611 are now clustered in an upper portion thereof. Accordingly, airflow can only enter into plenum 140 from an upper height that corresponds to the upper portion of wall 611. This approach forces the airflow to be closer to the hard drive 100a surface that is to be cooled, while still being forced downward into the blower by ramp 110. Note that the size of the perforations in interior wall 611 may be the same as, or different from, the size of the perforations in exterior wall 612. For example, the perforations in interior wall 611 may be larger in size than those in exterior wall 612. Note that in an alternative embodiment, the interior wall 511 or 611 may be removed entirely if not needed for structural integrity requirements of this portion of the system.

As contrasted to prior art cooling approaches which rely on fans, blowers used in an embodiment of the present invention add impedance and pressure loss (while not significantly impacting overall airflow rate). As will be understood, a computing device such as a server typically contains numerous components, and use of the enhanced cooling system described herein is believed to deliver better cooling throughout the housing of the system. Blowers also generally have a lower acoustical signature than fans, which will tend to reduce the audio acoustic noise of the computing device, due in large part to the ability to take advantage of a blower producing more pressure and therefore needing lower airflow through a well-ducted system as compared to the amount of airflow required when using fans with less airflow channeling and ducting.

Ramps as described herein also block some line-of-sight viewing, through perforated segment 510 or perforated segment 610, to the blower intake area 130a of blower 130. This also provides an acoustical benefit (although on the order of only several decibels). Additional acoustical absorbing material may be added to the ramp, if desired, to further dampen sound that may be coming, for example, from the blower or air intake. Ramps as described herein also serve as a finger guard in a case where someone might remove a first-level hard drive 100a: the ramp makes it unlikely that the person could reach in far enough to contact the blower intake area 130a, thus providing a measure of safety. Anti-recirculation flaps 150 also generally prevent a person from pushing their fingers into the blower exit area 130b of blower 130. Thus, no additional finger guards are required on the individual blower unit. Omitting the requirement of finger guards also slightly increases the efficiency of the blower device and reduces some acoustic penalties.

Figure 7:
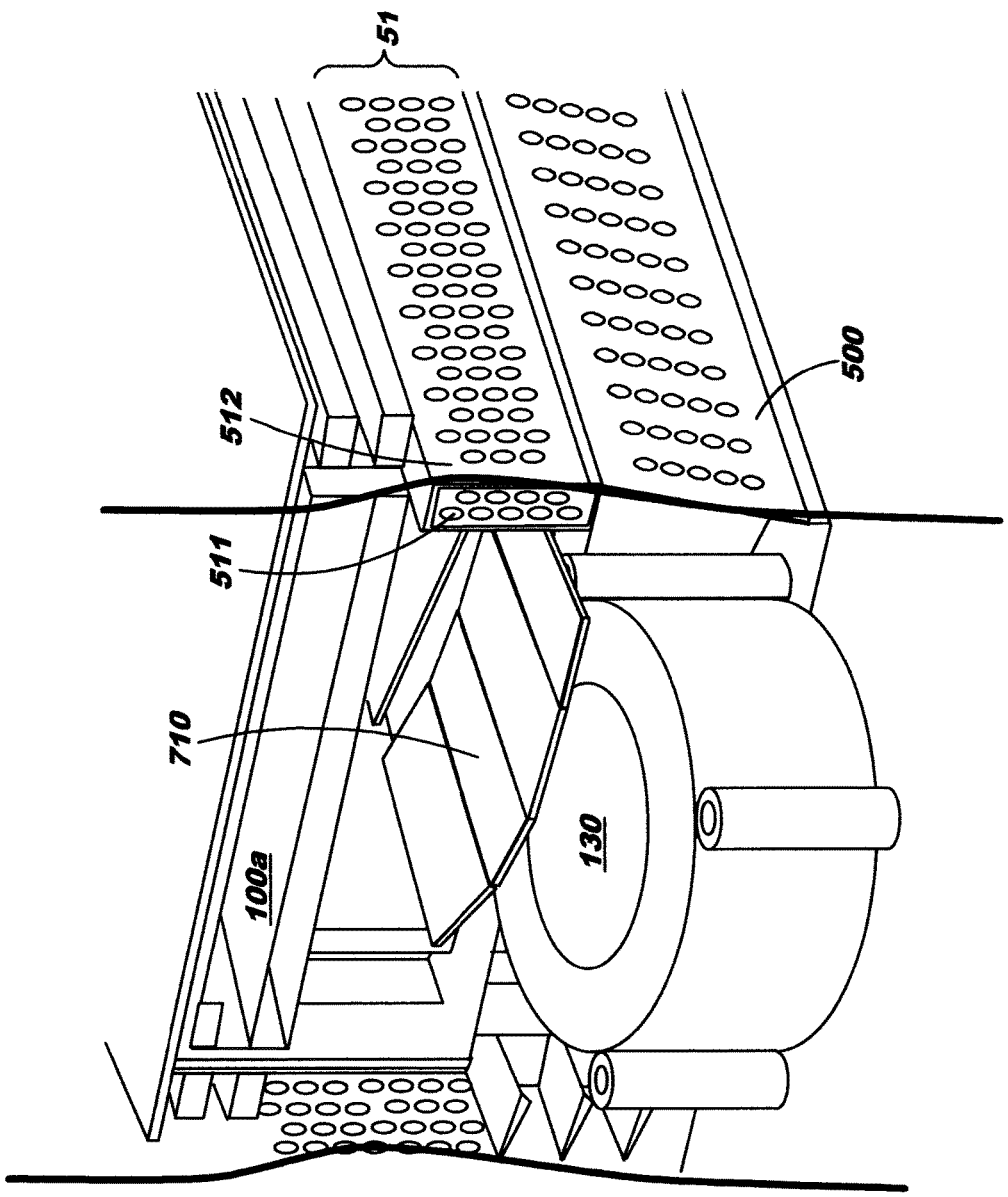
FIG. 7 illustrates an alternative configuration of an airflow deflection surface.

FIG. 7 illustrates an alternative configuration for the airflow deflection surface, or ramp. In this alternative, shown at reference number 710, the ramp has a greater number of segments as compared to ramp 110. FIG. 7 also illustrates that the segments of ramp 710 may be placed at multiple angles.

As can be seen from the above discussions, an embodiment of the present invention enhances cooling of components in a computing device. While discussions herein are primarily in terms of enhancing cooling within a server device, this is by way of illustration and not of limitation: cooling techniques disclosed herein may be used with other types of devices without deviating from the scope of the present invention.

While embodiments of the present invention have been described, additional variations and modifications in those embodiments may occur to those skilled in the art once they learn of the basic inventive concepts. Therefore, it is intended that the appended claims shall be construed to include the described embodiments and all such variations and modifications as fall within the spirit and scope of the invention. It is also to be noted that while aspects of the present invention are referred to herein with regard to "an embodiment" of the present invention, this should not be construed as requiring each aspect to be present in a single embodiment.

The invention claimed is:

1. A cooling system for electronic components within a computing device, comprising:
   an air mover having an intake and an exit;
   an electronic component placed in an inverted alignment whereby a surface thereof having a higher heat transfer rate is facing downward toward the air mover;
   an airflow deflection surface disposed in a plenum, the plenum being disposed between the air mover and the surface of the electronic component; and
   the airflow deflection surface and the intake causing an airflow path that cools the surface of the electronic component to pass, at least in part, between the downward-facing surface of the electronic component and an upper side of the airflow deflection surface before entering into the intake of the air mover, the upper side of the airflow deflection surface being disposed toward the downward-facing surface of the electronic component, wherein:
      air enters the cooling system through a hollow chamber disposed as an outer wall of a housing of the computing device, the hollow chamber comprising an outer chamber wall and an inner chamber wall, the outer chamber wall comprising a first plurality of perforations that allow the air to enter the chamber and the inner chamber wall comprising a second plurality of perforations that allow the air to enter the cooling system without being overly impeded, the second plurality of perforations being fewer in number than the first plurality; and
      the second plurality of perforations are clustered in an upper portion of the inner chamber wall to cause the airflow to enter into the plenum from an upper height so as to be in close proximity to the downward-facing surface of the electronic component before being forced downward into the air mover by the airflow deflection surface.

2. The cooling system according to claim 1, further comprising:
   a downstream electronic component, the downstream electronic component placed in the inverted alignment whereby the surface thereof having the higher heat transfer rate is facing downward toward the exit of the air mover;
   a downstream plenum, the downstream plenum formed at least in part by the downward-facing surface of the downstream electronic component, the air mover, and a support member supporting the downstream electronic component, the downstream plenum receiving airflow from the exit of the air mover and causing the airflow path to cool the surface of the downstream electronic component by passing, at least in part, beneath the downward-facing surface of the downstream electronic component before exiting from the downstream plenum.

3. The cooling system according to claim 2, wherein the support member is configured with a plurality of perforations, the perforations providing airflow impedance to pressurize the downstream plenum while allowing the airflow to exit the downstream plenum.

4. The cooling system according to claim 3, wherein the perforations further reduce a velocity of airflow exiting from the exit of the air mover.

5. The cooling system according to claim 1, wherein the air mover is a blower.

6. The cooling system according to claim 1, wherein the electronic component is a hard disk drive.

7. The cooling system according to claim 1, wherein the electronic component is a solid state drive.

8. The cooling system according to claim 1, wherein the airflow deflection surface is configured as an angled ramp.

9. The cooling system according to claim 1, wherein the electronic component placed in the inverted alignment is placed along a front of the housing.

10. A method for cooling electronic components within a computing device, comprising:
    disposing an air mover within a housing of the computing device, the air mover having an intake and an exit;
    placing an electronic component within the housing in an inverted alignment whereby a surface thereof having a higher heat transfer rate is facing downward toward the air mover;
    disposing an airflow deflection surface in a plenum within the housing, the plenum being disposed between the air mover and the surface of the electronic component, whereby the airflow deflection surface and the intake cause an airflow path that cools the surface of the electronic component to pass, at least in part, between the downward-facing surface of the electronic component and an upper side of the airflow deflection surface before entering into the intake of the air mover, the upper side of the airflow deflection surface being disposed toward the downward-facing surface of the electronic component, wherein:

air enters the cooling system through a hollow chamber disposed as an outer wall of a housing of the computing device, the hollow chamber comprising an outer chamber wall and an inner chamber wall, the outer chamber wall comprising a first plurality of perforations that allow the air to enter the chamber and the inner chamber wall comprising a second plurality of perforations that allow the air to enter the cooling system without being overly impeded, the second plurality of perforations being fewer in number than the first plurality; and the second plurality of perforations are clustered in an upper portion of the inner chamber wall to cause the airflow to enter into the plenum from an upper height so as to be in close proximity to the downward-facing surface of the electronic component before being forced downward into the air mover by the airflow deflection surface.

11. The method according to claim 10, further comprising:

placing an additional electronic component downstream of the electronic component, the downstream electronic component placed in the inverted alignment whereby the surface thereof having the higher heat transfer rate is facing downward toward the exit of the air mover;

disposing a downstream plenum in the housing, the downstream plenum formed at least in part by the downward-facing surface of the downstream electronic component, the air mover, and a support member supporting the downstream electronic component, the downstream plenum receiving airflow from the exit of the air mover and causing the airflow path to cool the surface of the downstream electronic component by passing, at least in part, beneath the downward-facing surface of the downstream electronic component before exiting from the downstream plenum, wherein the support member is configured with a plurality of perforations, the perforations providing airflow impedance to pressurize the downstream plenum while allowing the airflow to exit the downstream plenum, wherein the perforations further reduce a velocity of airflow exiting from the exit of the air mover.

12. The method according to claim 10, wherein the air mover is a blower.

13. The method according to claim 10, wherein the electronic component is selected from the group consisting of a hard disk drive, a redundant array of independent Solid State Drives (SSDs), an electronic component card, or a micro-tape drive in a form factor of a hard disk drive.

14. The method according to claim 10, wherein the electronic component is a solid state drive.

15. The method according to claim 10, wherein the airflow deflection surface is configured as an angled ramp.

16. A cooling system for electronic components within a computing device, comprising:

an air mover having an intake and an exit;

an electronic component placed in an inverted alignment whereby a surface thereof having a higher heat transfer rate is facing downward toward the air mover;

an airflow deflection surface disposed in a plenum, the plenum being disposed between the air mover and the surface of the electronic component; and the airflow deflection surface and the intake causing an airflow path that cools the surface of the electronic component to pass, at least in part, between the downward-facing surface of the electronic component and an upper side of the airflow deflection surface before entering into the intake of the air mover, the upper side of the airflow deflection surface being disposed toward the downward-facing surface of the electronic component, wherein:

air enters the cooling system through a chamber disposed on an outer wall of a housing of the computing device, the chamber comprising an outer chamber wall and an inner chamber wall, the outer chamber wall comprising a first plurality of perforations that allow the air to enter the chamber and the inner chamber wall comprising a second plurality of perforations that allow the air to enter the cooling system without being overly impeded, the second plurality of perforations being fewer in number than the first plurality; and the second plurality of perforations are positioned so as to cause the airflow to enter into the plenum in close proximity to the downward-facing surface of the electronic component before being forced into the air mover by the airflow deflection surface.

17. The cooling system according to claim 16, wherein the airflow deflection surface is configured as an angled ramp.

18. The cooling system according to claim 17, wherein the angled ramp comprises a plurality of segments.

19. The cooling system according to claim 18, wherein the segments of the angled ramp are disposed at a plurality of angles.

20. The cooling system according to claim 16, wherein the air mover is a blower.

* * * * *